United States Patent [19]
Robb et al.

[11] Patent Number: 5,747,371
[45] Date of Patent: May 5, 1998

[54] METHOD OF MANUFACTURING VERTICAL MOSFET

[75] Inventors: Francine Y. Robb; Stephen P. Robb, both of Tempe; Jean-Michel Reynes, Phoenix; Li-Hsin Chang, Chandler, all of Ariz.

[73] Assignee: Motorola, Inc., Schaumburg, Ill.

[21] Appl. No.: 684,802

[22] Filed: Jul. 22, 1996

[51] Int. Cl.$^6$ .................................................. H01L 21/336
[52] U.S. Cl. ........................ 438/273; 438/543; 438/546; 438/904
[58] Field of Search ............... 437/11, 24, 40 DM, 437/41 DM, 142, 149, 150, 959; 148/DIG. 23, DIG. 40, DIG. 126; 438/268, 273, 528, 530, 543, 545, 546, 904, 917, 918

[56] References Cited

U.S. PATENT DOCUMENTS

| | | | |
|---|---|---|---|
| 4,053,925 | 10/1977 | Burr et al. | 437/24 |
| 4,203,780 | 5/1980 | Matsushita et al. | 437/24 |
| 4,717,588 | 1/1988 | Wilson et al. | 437/142 |
| 4,987,098 | 1/1991 | Nishiura et al. | 437/142 |
| 5,227,315 | 7/1993 | Frisina et al. | 437/142 |
| 5,441,900 | 8/1995 | Bulucea et al. | 437/142 |

FOREIGN PATENT DOCUMENTS 6125848   10/1981   Japan.
4017372   1/1992   Japan.

OTHER PUBLICATIONS

S. Coffa et al., J. Appl. Phys., American Institute of Physics, vol. 69, No. 3, Feb. 1991, pp. 1350–1354.

Marisa Francesca Catania et al., IEEE Transactions on Electron Devices, "Optimization of the Tradeoff Between Switching Speed of the Internal Diode and On-Resistance in Gold-and Platinum-Implanted Power Metal-Oxide-Semiconductor Devices", vol. 39, No. 12, Dec. 1992, pp. 2745–2748.

Monique Bagneres Moisseron, Laboratoire d'Analyse et d'Architecture des Systèmes, "These—Etude de procédés technologiques pour le contrôle des propriétés de commutation des composants bipolaires de puissance", Jun. 29, 1995, Chapter 2, pp. 32–61.

Primary Examiner—Chandra Chaudhari
Attorney, Agent, or Firm—George C. Chen

[57] ABSTRACT

A semiconductor device includes a substrate (11), a first region (21) in the substrate (11) wherein the first region (21) has a first conductivity type, a second region (22) in the substrate (11) wherein the second region (22) is adjacent to the first region (21) and wherein the second region (22) has a second conductivity type different from the first conductivity type, and a third region (24) in the substrate (11) wherein the third region (24) overlaps the first and second regions (21, 22) and wherein the third region (24) has a damaged crystalline structure.

20 Claims, 4 Drawing Sheets

5,747,371

1

METHOD OF MANUFACTURING VERTICAL MOSFET

BACKGROUND OF THE INVENTION

This invention relates, in general, to semiconductors, and more particularly, to semiconductor devices and methods of manufacture.

Vertical metal-oxide-semiconductor field effect transistors (MOSFETs) are generally not fully self-aligned devices. Typically, one or two extra photolithographic masks are required to align a highly doped p-type region in an n-channel vertical MOSFET to reduce the effects of a parasitic bipolar transistor in the MOSFET. However, the extra photolithographic masks increase the cycle time and cost required to manufacture the MOSFET. Furthermore, misalignment of the extra photolithographic masks can degrade the electrical performance of the MOSFET.

Accordingly, a need exists for a semiconductor device that is self-aligned to reduce the cost and cycle time of manufacturing the semiconductor device. The self-aligned method of manufacture should also abate the effects of parasitic devices within the semiconductor device.

DETAILED DESCRIPTION OF THE DRAWINGS

Figure 1:
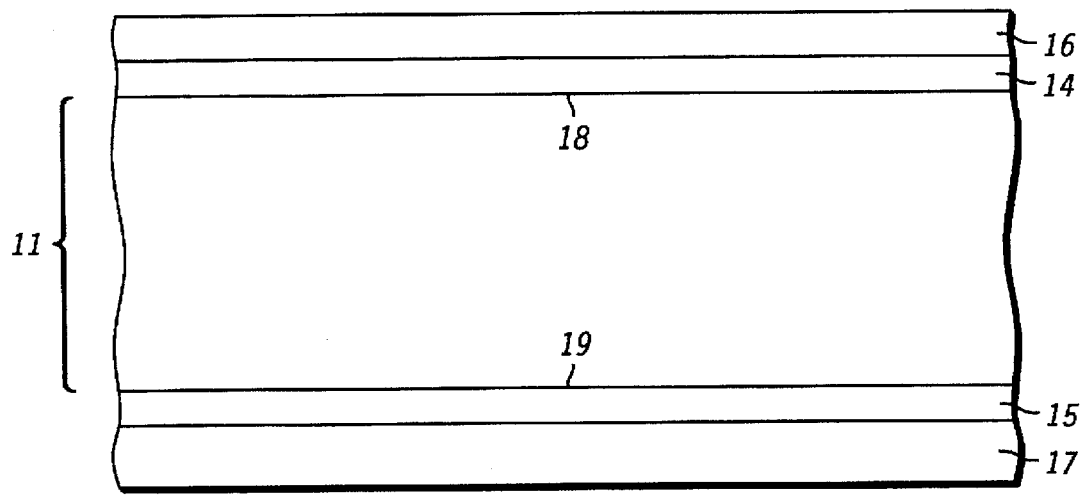
FIG. 1 illustrates a partial cross-sectional view of an embodiment of a semiconductor device in accordance with the present invention.

FIG. 1 illustrates a partial cross-sectional view of an embodiment of a semiconductor component or semiconductor device 10. Device 10 includes a semiconductor substrate 11 that has a surface 18 and a surface 19 that is opposite surface 18. Substrate 11 is comprised of a semiconductor material such as silicon, gallium arsenide, or the like. The semiconductor of substrate 11 preferably has a substantially crystalline structure for proper electrical operation of device 10. Substrate 11 is doped and has a first conductivity type.

A dielectric or electrically insulating layer 14 is provided over surface 18 of substrate 11. Layer 14 should have a uniform thickness and should be a high quality film having few impurities because layer 14 serves as a gate dielectric or gate insulator for device 10. Accordingly, layer 14 is preferably comprised of a thermally grown silicon oxide or other high quality electrical insulator. An optional dielectric or electrically insulating layer 15 can be provided adjacent to surface 19 of substrate 11. Layer 15 is similar to layer 14, and layers 14 and 15 can be formed simultaneously.

An electrically conductive layer 16 is provided over layer 14 and surface 18 of substrate 11. As explained hereinafter, layer 16 forms a gate electrode for device 10. Therefore, layer 16 is preferably comprised of doped polycrystalline silicon deposited by a chemical vapor deposited (CVD) process. An optional electrically conductive layer 17 can be provided adjacent to layer 15 and surface 19 of substrate 11. Layer 17 is similar to layer 16, and layers 16 and 17 can be formed simultaneously.

Figure 2:
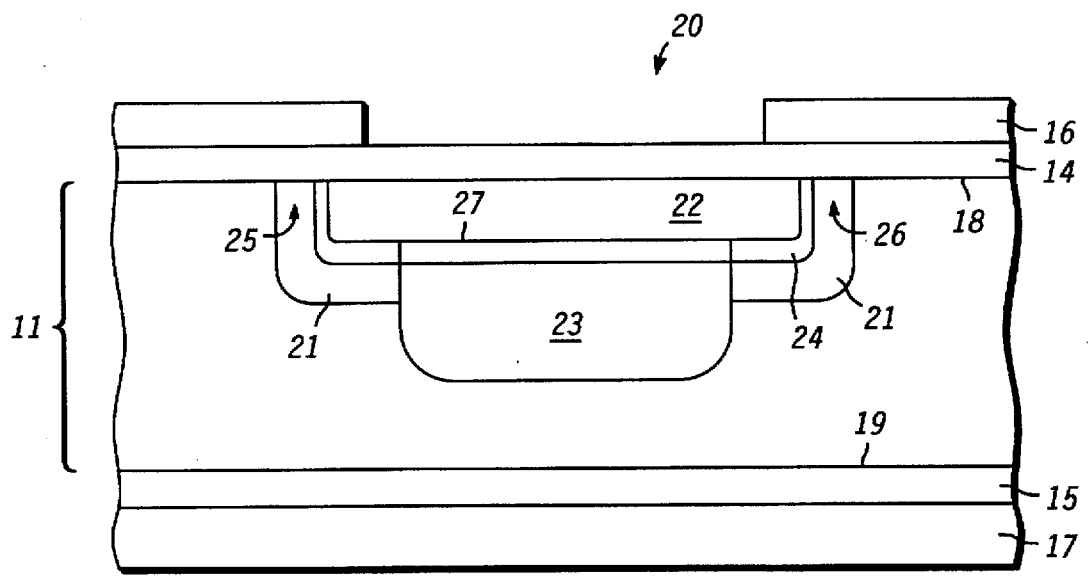
FIG. 2 portrays a partial cross-sectional view of the semiconductor device of FIG. 1 after subsequent manufacturing in accordance with the present invention.
Figure 3:
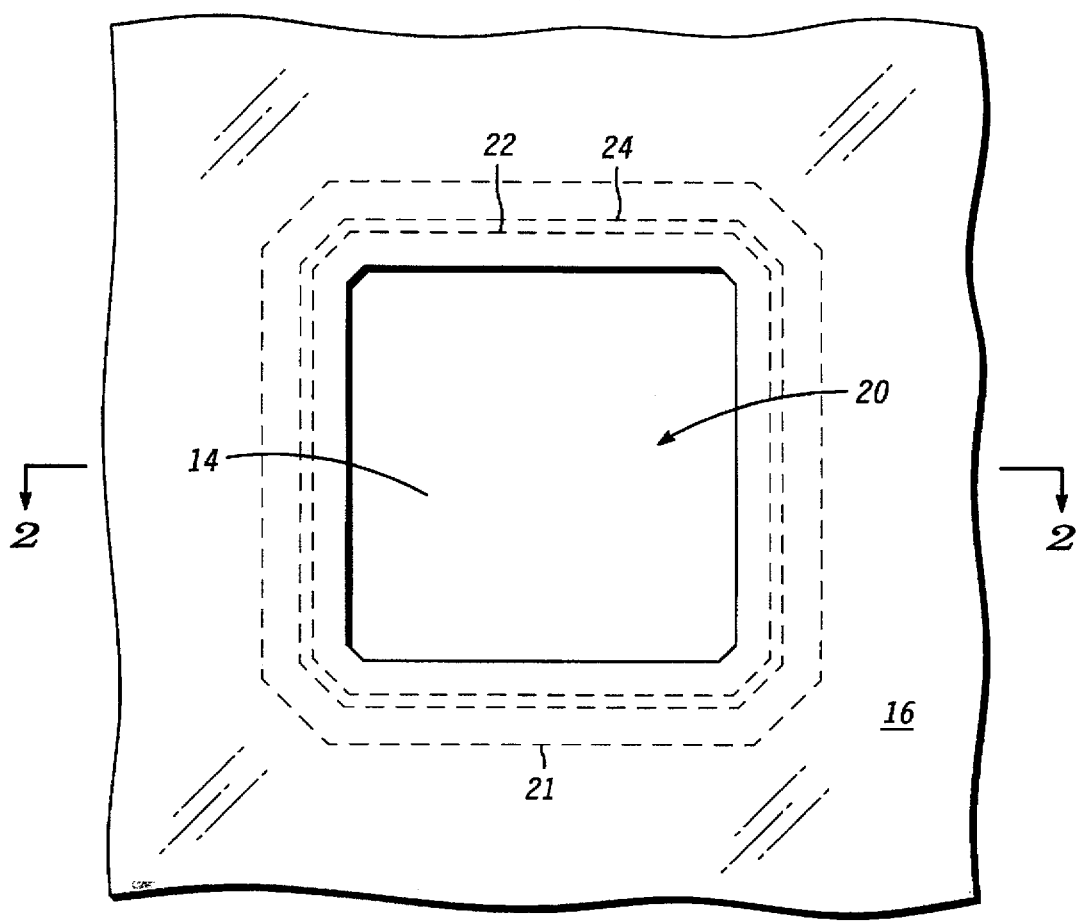
FIG. 3 represents a partial top view of the semiconductor device of FIG. 2 in accordance with the present invention.

FIG. 2 portrays a partial cross-sectional view of device 10 after subsequent manufacturing, and FIG. 3 represents a partial top view of device 10 in FIG. 2. FIG. 2 is taken along a section line 2—2 in FIG. 3. It is understood that the same reference numerals are used in the figures to denote the same elements. FIGS. 2 and 3 portray layer 16 after being etched or patterned to form a gate electrode for device 10. The etching or patterning step forms a gate opening 20 in the gate electrode or layer 16. When layer 16 is comprised of polysilicon, a fluorine chemistry can be used to dry etch or pattern layer 16.

A lightly doped region 21 is formed in substrate 11 after the etching of layer 16. Portions 25 and 26 of region 21 serve as channel regions for device 10 and underlie portions of layer 16. Preferably, region 21 is implanted into substrate 11 and is self-aligned to opening 20 to reduce the cost, to reduce the cycle time, and to improve the manufacturing yield of device 10. Region 21 has a conductivity type different from the conductivity type of substrate 11. For example, when substrate 11 is comprised of n-type silicon, region 21 can be comprised of p-type silicon. To form a p-type silicon region 21, a dose of approximately $1 \times 10^{13}$–$3 \times 10^{14}$ atoms per centimeter squared (atoms/cm$^2$) of boron ions can be implanted into substrate 11 with an energy of approximately 40–80 kiloelectron volts (keV). After the ion implantation step, region 21 can then be annealed at a temperature of approximately 1,000–1,300 degrees Celsius (°C) for approximately 30–100 minutes in order to activate and diffuse the implanted ions of region 21 within substrate 11.

Because opening 20 is used as a self-aligned implant mask for region 21 and for other subsequently described regions, layers 14 and 16 should have a sufficient thickness to prevent the ion implantation of region 21 and of the other subsequently described regions from penetrating through layers 14 and 16 and into the regions of substrate 11 that are covered by layers 14 and 16. Accordingly, when the ion implant conditions that are described herein are used to form the self-aligned regions in substrate 11, layers 14 and 16 can have thicknesses of greater than approximately 100 angstroms (Å) and greater than approximately 900 Å, respectively.

Next, a heavily doped region 22 is formed in region 21 of substrate 11. Region 22 is adjacent to portions 25 and 26 of region 21, and a portion of region 21 remains beneath or underlies region 22. Region 22 serves as a source region for device 10. Therefore, region 22 has a doping concentration greater than that of region 21, and region 22 has a conductivity type different from that of region 21 and similar to that of substrate 11. For example, when region 21 is p-type, region 22 can be n-type wherein a p-n junction 27 is formed between regions 21 and 22. Preferably, region 22 is implanted into substrate 11 and is self-aligned to opening 20 to reduce the cost, to reduce the cycle time, and to improve the manufacturing yield of device 10. To form an n-type region 22, a dose of approximately $5 \times 10^{15}$–$5 \times 10^{16}$ atoms/cm$^2$ of arsenic or phosphorous ions can be implanted into substrate 11. Arsenic ions can be implanted with an energy of approximately 100–150 keV, and phosphorous ions can be implanted with an energy of approximately 50–100 keV. After implantation, region 22 can be annealed at a temperature of approximately 850°–1,000° C. for approximately 20–80 minutes in order to activate and diffuse the implanted ions of region 22 within substrate 11.

Thus, a vertical metal-oxide-semiconductor field effect transistor (MOSFET) has been partially formed within substrate 11. For instance, region 22 can serve as an n-type source region for the vertical MOSFET; p-type portions 25 and 26 can serve as channel regions for the vertical MOSFET; and other portions of n-type substrate 11 along surface 19 can serve as an n-type drain region for the vertical MOSFET. However, the vertical MOSFET also includes a parasitic bipolar transistor that degrades the electrical performance of device 10. For instance, n-type region 22 can serve as an emitter region for the parasitic bipolar transistor; p-type region 21 of device 10 can serve as a base region for the parasitic bipolar transistor; and other portions of n-type substrate 11 along surface 19 can serve as a collector region for the parasitic NPN bipolar transistor.

To reduce the effects of the parasitic bipolar transistor within device 10, an optional region 23 can be formed in substrate 11 to assist in the abatement of the effects of the parasitic bipolar transistor in device 10. Region 23 has the same conductivity type as region 21 but as a higher doping concentration than region 21. The use of region 23 to alleviate the effects of the parasitic bipolar transistor in device 10 is known and understood by those skilled in the art. However, the formation of region 23 is typically not self-aligned and may require an additional implant mask.

To further reduce the effects of the parasitic bipolar transistor within device 10, the crystalline lattice structure of substrate 11 at p-n junction 27 and in portions of regions 21 and 22 in substrate 11 are intentionally damaged to reduce the lifetime of minority carriers within region 21 and to reduce the beta or the gain of the parasitic bipolar transistor. The damaged crystalline lattice structure at p-n junction 27 and within region 21 forms recombination centers to reduce the emitter efficiency of the parasitic bipolar transistor. The damage to the crystalline structure of p-n junction 27 and of the portion of region 21 located adjacent to or beneath region 22 can be accomplished by implanting ions to form a region 24 in substrate 11. The ions used to form region 24 are preferably not elements that are considered to be dopants for substrate 11 so that the doping concentrations of regions 21 and 22 are not altered. Therefore, inert ions such as, for example, argon, nitrogen, or oxygen can be implanted into substrate 11 to form region 24, which is preferably self-aligned to opening 20 to reduce the cycle time and cost of manufacturing device 10. If desired, region 24 can then be annealed with a process similar to that used to anneal region 22. However, metal ions can also be implanted into substrate 11 to form region 24. Both inert ions and metal ions can reduce the minority carrier lifetime by damaging the crystalline structure of substrate 11, but some of the crystalline damage may be repaired or annealed out during subsequent high temperature steps. When a portion of the crystalline damage is repaired or restored, the decrease of the minority carrier lifetime is reduced. However, when metal ions are used to form region 24, the metal ions can further reduce the minority carrier lifetime by serving as electrical conductors for the minority carriers across p-n junction 27 and through region 21. Therefore, metal ions are preferred over inert ions for reducing the minority carrier lifetime in device 10.

When metal ions are used to form region 24, the diffusion coefficient of the metal ions should be similar to or smaller than that of the ions used to form region 22. In this manner, the metal ions will not diffuse a long distance compared to the ions of region 22, will not inadvertently short together other portions of device 10, and will not accidentally produce undesirably high leakage currents in the other portions of device 10. Furthermore, when the metal ions have a similar or smaller diffusion coefficient than the ions used to form region 22, the formation of region 24 can be performed prior to the formation of regions 21 or 22. Alternatively, instead of using three separate anneals for regions 21, 22, and 24, the three regions can be simultaneously activated and diffused during a single anneal. In this embodiment, regions 21, 22, and 24 can be implanted in any order. In yet another alternative embodiment, region 21 is implanted and diffused, and then regions 22 and 24 are implanted and simultaneously annealed. In this embodiment, region 22 is annealed only after the formation of region 24. Regardless of the specific implant and anneal process used to form regions 21, 22, and 24, layer 16 overlies region 22, region 24, and portions 25 and 26 of region 21 after the annealing of regions 21, 22, and 24.

Titanium, platinum, and gold are examples of suitable ions that can be implanted into substrate 11 to form region 24. However, titanium is preferred over platinum or gold because titanium has a smaller diffusion coefficient compared to either platinum or gold. When titanium is implanted to form region 24, a dose of approximately $1 \times 10^{12} - 1 \times 10^{16}$ atoms/cm$^2$ of titanium can be self-aligned to opening 20 and implanted into substrate 11 with an energy of approximately 100–400 keV.

Figure 4:
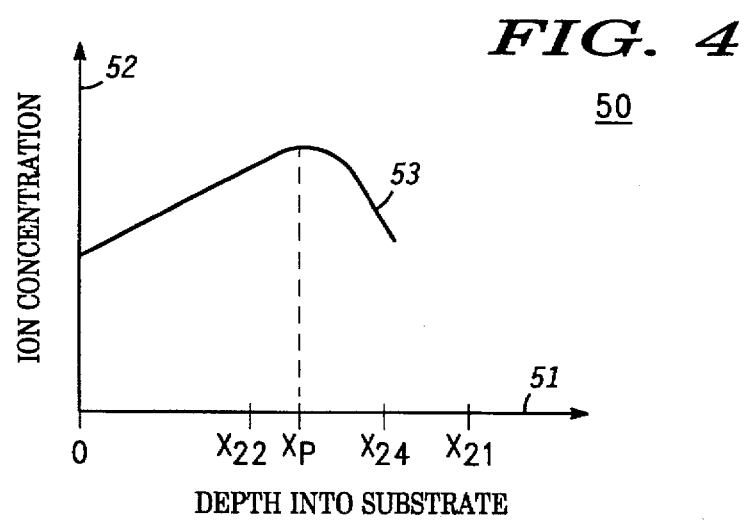
FIG. 4 depicts a graph of ion concentration in the semiconductor device of FIG. 2 in accordance with the present invention.

FIG. 4 depicts a graph 50 of the ion concentration of region 24 in substrate 11. An abscissa or x-axis 51 of graph 50 represents a depth of the ion concentration of region 24 in substrate 11, and an ordinate or y-axis 52 of graph 50 represents the ion concentration of region 24 Points $x_{22}$, $x_{24}$, and $x_{21}$, along axis 51 represent the junction depths of regions 22, 24, and 21, respectively, within substrate 11. Point $x_{22}$ also represents p-n junction 27 of FIG. 2. A curve 53 plotted against axes 51 and 52 depicts the preferred ion distribution of region 24 within substrate 11, and a point $x_p$ along axis 51 represents a position of the peak concentration of the ions in region 24. As illustrated in graph 50, region 24 overlaps portions of region 22, p-n junction 27, and region 21. The peak ion concentration of region 24 is preferably located within a portion of region 21 that is located beneath p-n junction 27 or beneath the junction depth of region 22. This preferred embodiment for region 24 maximizes the reduction of the effects of the parasitic bipolar transistor within device 10 because the peak ion concentration of region 24 approximates the most heavily damaged crystalline area within region 24.

If the peak of curve 53 is desired to be broader to increase the area of maximum crystalline damage and to modify the ion concentration profile of region 24, a second ion implantation can be performed for region 24 wherein the implant energy of the second ion implantation is different from the implant energy of the first ion implantation. Implantation techniques for modifying ion concentration profiles are known to those skilled in the art.

Figure 5:
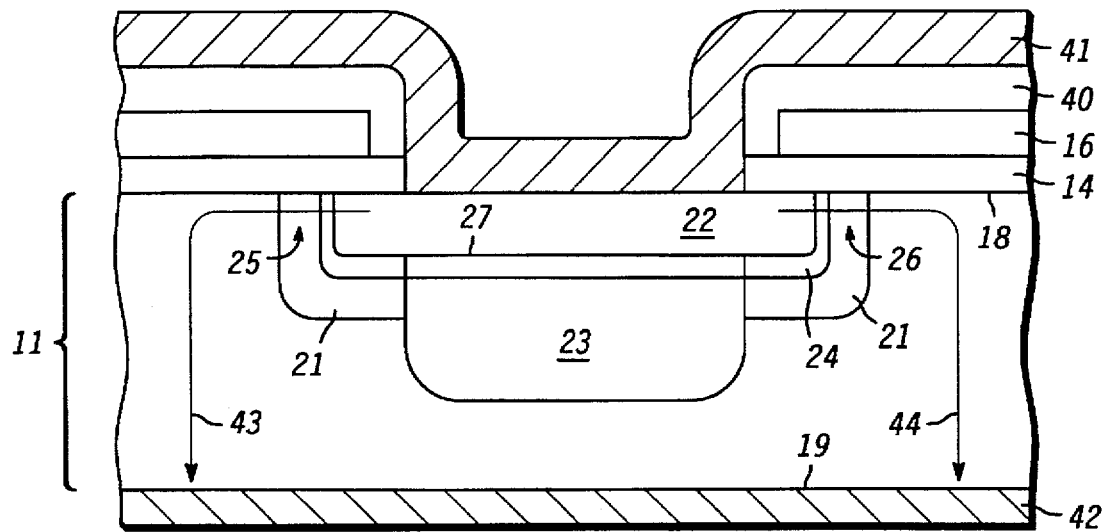
FIG. 5 illustrates a partial cross-sectional view of the semiconductor device of FIG. 2 after further processing in accordance with the present invention.

FIG. 5 illustrates a partial cross-sectional view of device 10 after further processing. Elements of FIG. 5 that have the same reference numerals as FIG. 2 are the same as the corresponding FIG. 2 elements. An electrically insulating or dielectric layer 40 is deposited over layers 14 and 16 and over surface 18 of substrate 11. Layer 40 can be comprised of silicon nitride, silicon oxide, or the like, and can be deposited using techniques known in the art such as, for example, CVD. An etch mask (not shown) is formed over layer 40, and layer 40 is patterned to form a dielectric opening or via that exposes a portion of opening 20. A portion of layer 40 remains within opening 20. The same etch mask can also be used for patterning layer 14 to expose a portion of surface 18 of substrate 11. When layers 14 and 40 are both comprised of silicon oxide, a fluorine chemistry can be used to dry etch or pattern layers 14 and 40.

An electrode 41 is formed in the exposed portion of opening 20 and overlies a portion of layers 40 and 16 and regions 21, 22, and 24. Layer 40 electrically isolates layer 16 from electrode 41. Electrode 41 serves as a source electrode for device 10 and is electrically coupled to region 22 in substrate 11. In device 10, electrode 41 is devoid of physical contact with portions of substrate 11 that have a conductivity type different from that of region 22.

Subsequently, another electrode 42 is formed adjacent to surface 19 of substrate 11 after the removal of layers 15 and 17 (FIG. 2) from surface 19. Electrode 42 serves as a backside drain electrode for device 10 and completes the formation of a vertical MOSFET. Arrows 43 and 44 represent the electron flow for n-channel current flow within device 10 from electrode 41, through substrate 11, and into electrode 42. It is understood that the output current and the power of device 10 can be increased by using electrodes 41 and 42 to electrically couple together a plurality of regions 21, 22, and 24 within substrate 11.

Figure 6:
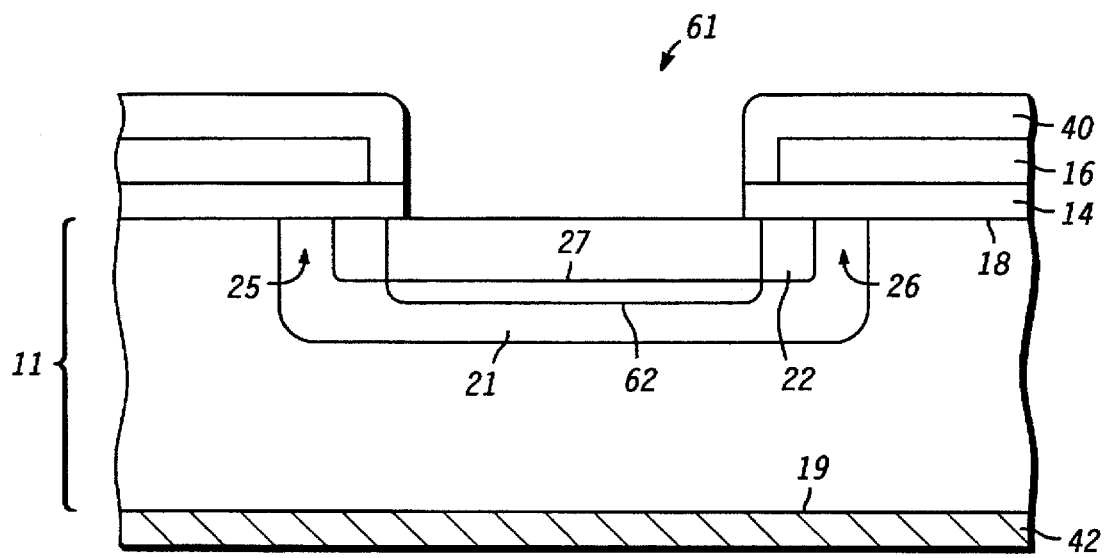
FIG. 6 portrays a partial cross-sectional view of an alternative embodiment of the semiconductor device in accordance with the present invention.

FIG. 6 portrays a partial cross-sectional view of a semiconductor component or device 60, which represents an alternative embodiment of device 10 (FIG. 2). It is understood that the same reference numerals are used in the figures to denote the same elements. In device 60, the inert or metal ion implantation is performed at a later step compared to device 10. In device 60, a damaged crystalline region 62 within substrate 11 is formed after the formation of regions 21 and 22 and after the patterning of layer 40. An opening or via 61 of layer 40 is used to self-align the ion implantation of region 62. Region 62 is typically a smaller region than region 24 (FIG. 2) because opening 61 is a portion of and is smaller than opening 20 (FIG. 2). Another difference between regions 24 and 62 is that region 24 is adjacent to and is also located within portions 25 and 26 of region 21 while region 62 is not located within portions 25 and 26. Region 62 will reduce the effects of the parasitic bipolar transistor in device 60, but region 24 reduces the parasitic effects more than region 62 because a portion of region 24 is located within channel portions 25 and 26 and because region 62 is not located within channel portions 25 and 26.

Figure 7:
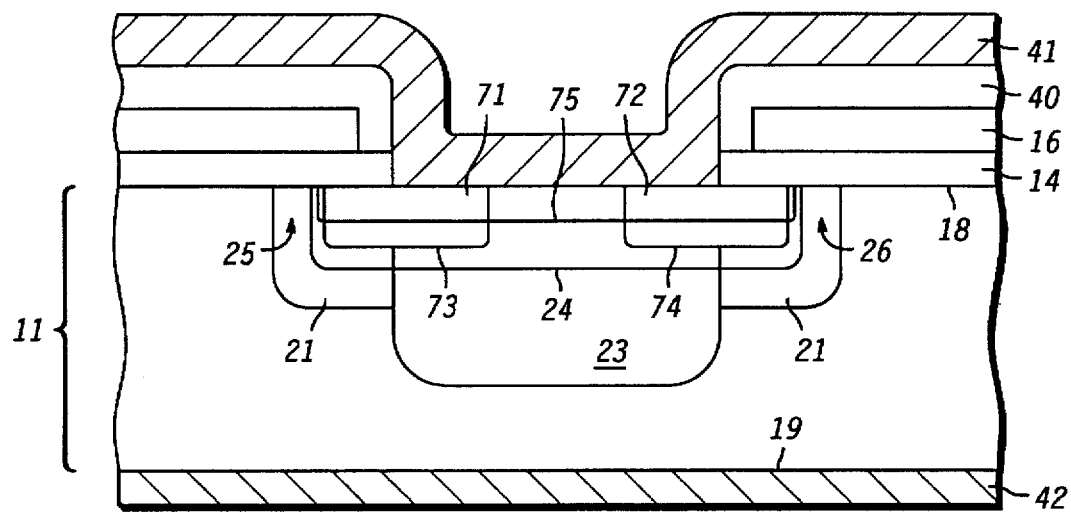
FIG. 7 represents a partial cross-sectional view of another alternative embodiment of the semiconductor device in accordance with the present invention.

FIG. 7 represents a partial cross-sectional view of a semiconductor component or device 70, which represents another alternative embodiment of device 10 (FIG. 5). It is understood that the same reference numerals are used in the figures to denote the same elements. Device 70 includes regions 71 and 72, which are similar to region 22 of device 10. Regions 71 and 72 form p-n junctions 73 and 74, respectively, with region 21. Region 23 physically contacts electrode 41 and is adjacent to p-n junctions 73 and 74 and regions 71, 72, and 21. Electrode 41 uses region 23 to electrically couple or short together region 21 with regions 71 and 72 to reduce the effects of the parasitic bipolar transistor. Damaged crystalline region 24 further reduces the parasitic effects within device 70.

The crystalline structure of substrate 11 can optionally be further damaged by a second ion implantation as represented by a region 75. Region 75 can be self-aligned to opening 20 (FIG. 2) of layer 16. Regions 24 and 75 can be adjusted to modify the peak concentration of crystalline damage within substrate 11. Alternatively, region 75 can be used in place of region 24. Region 75 is adjacent to and partially overlaps portions 25 and 26 of region 21 but is not located beneath p-n junctions 73 and 74.

Therefore, it is apparent there has been provided an improved semiconductor device and its method of manufacture that overcomes the disadvantages of the prior art. The semiconductor device described herein is self-aligned to reduce the cost and cycle time of manufacturing the device. The method of manufacturing the present device also reduces the effect of a parasitic transistor within the device. One skilled in the art will understand that the device described herein will also have an improved unclamped inductive switching energy.

While the invention has been particularly shown and described with reference to preferred embodiments, it will be understood by those skilled in the art that changes in form and detail may be made without departing from the spirit and scope of the invention. For instance, the numerous details set forth herein such as, for example, the implant doses and implant energies for regions 21, 22, and 24 are provided to facilitate the understanding of the present invention and are not provided to limit the scope of the invention. As another example, the damaged crystalline regions or the minority carrier recombination regions described herein can also be used in other types of semiconductor devices. Furthermore, regions 21, 22, and 24 of device 10 (FIG. 2) can be diffused into substrate 11 instead of being implanted into substrate 11. Additionally, a dielectric layer (not shown in FIG. 2) can be formed over gate layer 16 wherein opening 20 is formed by sequentially etching the dielectric layer and layer 16. In this alternative embodiment, layer 16 is protected from and is not damaged by the implant used to form region 24 within substrate 11. Moreover, a dielectric spacer can be formed within opening 20 (FIG. 2) or opening 61 (FIG. 6), and the implanted damaged regions 24 and 62 in FIGS. 2 and 6, respectively, can be self-aligned to the dielectric spacer within openings 20 and 61 to reduce the area of the damaged region within substrate 11. Accordingly, the disclosure of the present invention is not intended to be limiting. Instead, the disclosure of the present invention is intended to be illustrative of the scope of the invention, which is set forth in the following claims.

We claim:

1. A method of manufacturing a semiconductor device comprising:

providing a semiconductor substrate;

forming a first doped region in the semiconductor substrate, the first doped region having a first conductivity type;

annealing the first doped region:

forming a second doped region in the first doped region after annealing the first doped region, the second doped region having a second conductivity type different from the first conductivity type;

annealing the first and second doped regions; and damaging a portion of the first doped region to reduce a lifetime of minority carriers in the first doped region, the portion of the first doped region adjacent to the second doped region.

2. The method of claim 1 wherein the steps of forming the first doped region and forming the second doped region comprise forming a vertical metal-oxide-semiconductor field effect transistor wherein the second doped region is a source region for the vertical metal-oxide-semiconductor field effect transistor and wherein the vertical metal-oxide-semiconductor field effect transistor has a parasitic bipolar transistor wherein the portion of the first doped region is a base region for the parasitic bipolar transistor.

3. The method of claim 1 wherein the step of forming the second doped region includes forming a p-n junction between the first and second doped regions and wherein the step of damaging the portion of the first doped region includes damaging a portion of the p-n junction.

4. The method of claim 1 wherein the step of damaging the portion of the first doped region includes implanting ions into the portion of the first doped region.

5. The method of claim 4 further comprising:

forming a gate electrode over a portion of the semiconductor substrate wherein the gate electrode has a gate opening wherein the step of forming the first doped region includes implanting the first doped region and wherein the step of forming the second doped region includes implanting the second doped region and wherein the steps of implanting the first doped region and implanting the second doped region include self-aligning the first and second doped regions to the gate opening;

depositing a dielectric layer over the gate electrode, a portion of the dielectric layer in the gate opening; and etching a dielectric opening in the portion of dielectric layer wherein the step of implanting the ions includes self-aligning the ions to the dielectric opening.

6. The method of claim 4 further comprising forming a gate electrode over a portion of the semiconductor substrate wherein the steps of forming the first doped region, forming the second doped region, and implanting the ions include self-aligning the first doped region, the second doped region, and the ions to the gate electrode.

7. The method of claim 4 further comprising:

forming a gate electrode over a portion of the semiconductor substrate; and forming a dielectric layer over the gate electrode wherein the step of implanting the ions includes self-aligning the ions to the dielectric layer.

8. The method of claim 1 further comprising annealing the second doped region only after the step of damaging the portion of the first doped region.

9. The method of claim 1 wherein the step of damaging the portion of the first doped region includes damaging the portion of the first doped region before the step of forming the second doped region.

10. The method of claim 1 wherein the step of providing the semiconductor substrate includes providing the semiconductor substrate with a crystalline structure and wherein the step of damaging the portion of the first doped region includes damaging the crystalline structure of the portion of the first doped region.

11. A method of fabricating a semiconductor component comprising:

providing a substrate having a first surface and a second surface opposite the first surface;

forming a gate electrode over a portion of the first surface of the substrate;

self-aligning a doped region to the gate electrode, the doped region formed in the substrate wherein a first portion of the doped region is a channel region;

self-aligning a source region to the gate electrode, the source region formed in the substrate, the source region adjacent to the first portion of the doped region, and a second portion of the doped region underlying the source region; and implanting ions with a first implant energy into the source region and into the second portion of the doped region, the ions comprised of titanium and a peak concentration of the ions implanted into the second portion of the doped region.

12. The method of claim 11 wherein the step of implanting the ions includes providing the ions in a portion of the channel region.

13. The method of claim 11 further comprising implanting the ions with a second implant energy to modify a concentration profile of the ions in the substrate.

14. The method of claim 11 wherein the step of self-aligning the source region includes forming an emitter region for a parasitic bipolar transistor and wherein the step of implanting the ions includes forming recombination centers in the second portion of the doped region to reduce an emitter efficiency of the parasitic bipolar transistor.

15. The method of claim 11 further comprising:

etching an opening in the gate electrode wherein the steps of self-aligning the doped region, self-aligning the source region, and implanting the ions includes self-aligning the doped region, the source region, and the ions to a portion of the opening;

forming a source electrode in the opening wherein the source electrode is electrically coupled to the source region; and forming a drain electrode adjacent to the second surface of the substrate.

16. A method of making an electronic device comprising:

providing a semiconductor substrate;

forming an implant mask over the semiconductor substrate, the implant mask having a hole;

forming a first region in the semiconductor substrate, the first region having a first conductivity type and self-aligned to the hole in the implant mask;

forming a second region in the semiconductor substrate and in the first region, the second region having a second conductivity type and self-aligned to the hole in the implant mask; and damaging a portion of the first region to reduce the minority carrier lifetime in the first region, the portion of the first region self-aligned to the hole in the implant mask.

17. The method of claim 16 wherein damaging the portion of the first region further comprises forming the portion of the first region contiguous with the second region.

18. The method of claim 16 wherein forming the first region comprises providing a doping concentration for the first region, wherein forming the second region comprises providing a doping concentration for the second region, and wherein damaging the portion of the first region comprises keeping the doping concentration of the first region and the doping concentration of the second region substantially unaltered.

19. The method of claim 16 wherein forming the second region includes keeping the second region within the first region.

20. The method of claim 16 wherein forming the second region includes keeping the second region within the portion of the first region.

* * * * *